United States Patent
Cho

(10) Patent No.: US 7,436,730 B2
(45) Date of Patent: Oct. 14, 2008

(54) METHOD AND DEVICE FOR CONTROLLING INTERNAL POWER VOLTAGE, AND SEMICONDUCTOR MEMORY DEVICE HAVING THE SAME

(75) Inventor: Jin-Hyung Cho, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 506 days.

(21) Appl. No.: 11/154,076

(22) Filed: Jun. 15, 2005

(65) Prior Publication Data

US 2005/0275986 A1    Dec. 15, 2005

(30) Foreign Application Priority Data

Jun. 15, 2004    (KR)    ............... 10-2004-0043838

(51) Int. Cl.
*G11C 5/14*    (2006.01)
(52) U.S. Cl. ................... 365/226; 365/233.13
(58) Field of Classification Search ............... 365/226, 365/233.13
See application file for complete search history.

(56) References Cited

U.S. PATENT DOCUMENTS

| | | |
|---|---|---|
| 5,734,281 A | 3/1998 | Morishima et al. |
| 6,075,741 A | 6/2000 | Ma et al. |
| 6,691,248 B1 * | 2/2004 | Nishijima et al. ............... 714/14 |
| 2003/0156440 A1 * | 8/2003 | Hata et al. ................... 365/49 |
| 2004/0046595 A1 * | 3/2004 | Ikehashi et al. .............. 327/157 |
| 2004/0268278 A1 * | 12/2004 | Hoberman et al. ............. 716/5 |

FOREIGN PATENT DOCUMENTS

| | | |
|---|---|---|
| KR | 10-0226221 | 7/1999 |
| KR | 2003-0009141 | 1/2003 |

OTHER PUBLICATIONS

English language abstract of the Korean Publication No. 2003-0009141.

* cited by examiner

*Primary Examiner*—Thong Q Le
(74) *Attorney, Agent, or Firm*—Marger Johnson & McCollom, P.C.

(57) ABSTRACT

In an embodiment, a device controls an internal power voltage in a semiconductor device. The device uses internal and external power voltages during a power-up period, and includes a power-up flag signal generator and a control circuit. The power-up flag signal generator generates a power-up flag signal based on the external power voltage. The control circuit provides a first internal power voltage to a peripheral circuit of the semiconductor device. During power-up the first internal power voltage varies according to a level of the external power voltage in response to the power-up flag signal having a first logic level. Accordingly, an internal power voltage may have a linear power-up slope during the power-up period and an initialization failure of any latch circuits in the peripheral circuit may be avoided. Also, power consumption of the latch circuits is reduced.

15 Claims, 6 Drawing Sheets

US 7,436,730 B2

METHOD AND DEVICE FOR CONTROLLING INTERNAL POWER VOLTAGE, AND SEMICONDUCTOR MEMORY DEVICE HAVING THE SAME

CLAIM FOR PRIORITY

This application claims priority from Korean Patent Application No. 2004-43838 filed on Jun. 15, 2004 in the Korean Intellectual Property Office (KIPO), the entire contents of which are hereby incorporated by reference.

BACKGROUND OF THE INVENTION

1. Field of the Invention

The present invention relates to a semiconductor memory device using internal and external power voltages, and in particular to a method and a device for controlling the internal power voltage during a power-up period in the semiconductor memory device using the internal and the external power voltage.

2. Description of the Related Art

As the term implies, 'power-up' refers to an external power voltage that is provided to a semiconductor device upon a starting operation.

FIG. 1 is a block diagram illustrating a conventional IVC (Internal Voltage Converter) in a semiconductor memory device using internal power voltage Vint and external power voltage Vext. FIG. 2 is a graph illustrating the changing internal power voltage Vint and external power voltage Vext during a power-up period in a semiconductor memory device.

Referring to FIG. 1, the IVC (Internal Voltage Converter) 10 generates the internal power voltage Vint using the external power voltage Vext. A first voltage drop of the external power voltage Vext is caused by an RC input terminal 12 and a second voltage drop of the internal power voltage Vint is caused by an RC output terminal 14 coupled to an output of the IVC 10.

As illustrated in FIG. 2, the external power voltage Vext, which may be supplied from a pad of a semiconductor memory device, has a linear power-up slope during a power-up period. This linearity may be attributed to the external power voltage Vext being supplied by a virtually unlimited power source.

This is not the case, however, for the internal power voltage Vint, which is supplied from circuitry of the IVC. This circuitry embodies elements that result in a time-dependent transient voltage that lags behind that of Vext during a power-up period. This can be seen as Vint lagging behind Vext in FIG. 2 during the period A.

SUMMARY OF THE INVENTION

Accordingly, embodiments of the present invention provide an internal voltage Vint that does not substantially lag behind the external voltage Vext during a power-up period.

In an embodiment, the internal power voltage Vint may have a linear power-up slope in a semiconductor device, along with the external power voltage Vext.

In some embodiments of the present invention, a device controls the internal power voltage with a power-up flag signal generator configured to generate a power-up flag signal based on the external power voltage.

According to exemplary embodiments of the present invention, a device for controlling the internal power voltage during a power-up period may be applied to a semiconductor memory device, such as a DRAM (Dynamic Random Access Memory) or a DDR SDRAM (Double Data Rate Synchronous Dynamic Random Access Memory).

BRIEF DESCRIPTION OF THE DRAWINGS

The above and other features and advantages of the present invention will become more apparent by describing in detail exemplary embodiments thereof with reference to the accompanying drawings, in which.

DESCRIPTION OF EMBODIMENTS

Figure 1:
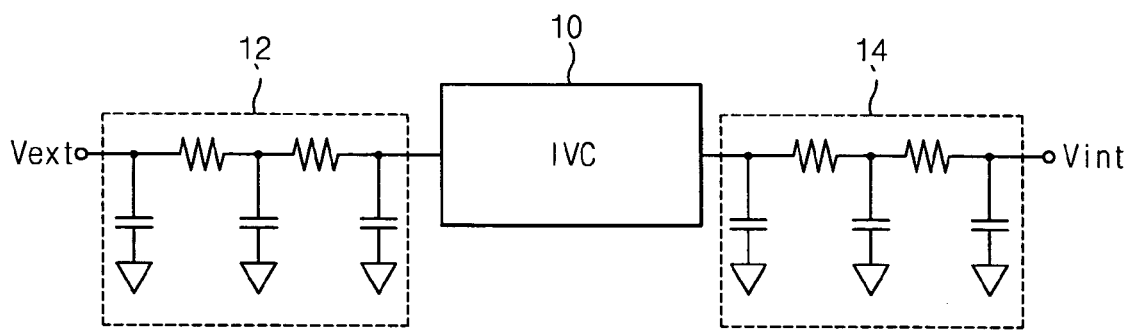
FIG. 1 is a block diagram illustrating a conventional IVC (Internal Voltage Converter) in a semiconductor memory device using internal power voltage Vint and external power voltage Vext.
Figure 2:
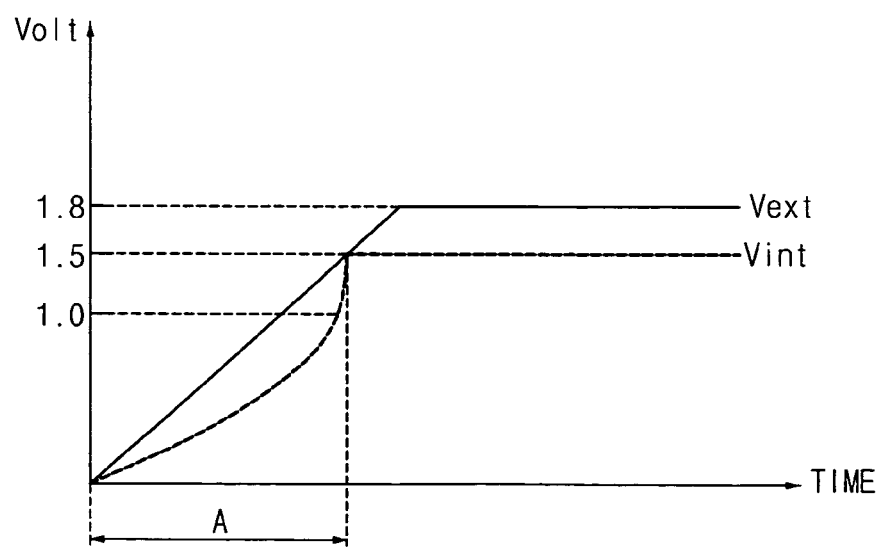
FIG. 2 is a graph illustrating time-dependent variations of the internal power voltage Vint and the external power voltage Vext during a power-up period in a semiconductor memory device.

Detailed illustrative embodiments of the present invention are disclosed herein. However, specific structural and functional details disclosed herein are merely representative for purposes of describing exemplary embodiments of the present invention. This invention may, however, be embodied in many alternate forms and should not be construed as limited to the embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

A semiconductor memory device, for example, a DDR SDRAM (Double Data Rate Synchronous Dynamic Random Access Memory), uses a power-up flag signal PVCCH to initialize a peripheral circuit including latch circuits in a semiconductor memory device.

Figure 3:
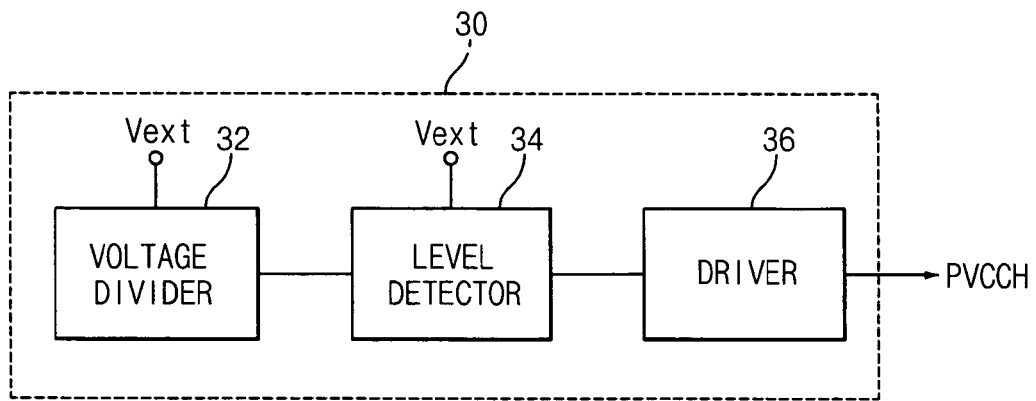
FIG. 3 is a block diagram illustrating a power-up flag signal (PVCCH) generator with an external power voltage Vext used as a power-supply voltage.
Figure 4:
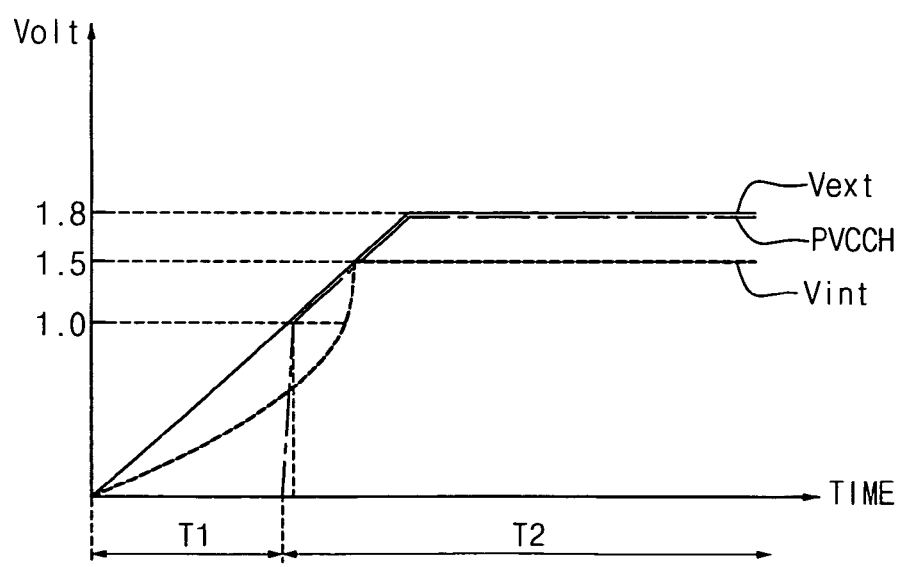
FIG. 4 is a graph illustrating a time-dependent variation of the power-up flag signal PVCCH of FIG. 3 during a power-up period.

FIG. 3 is a block diagram illustrating a power-up flag signal (PVCCH) generator with an external power voltage Vext used as a power-supply voltage. FIG. 4 is a graph illustrating a time-dependent variation of the power-up flag signal PVCCH of FIG. 3 during the power-up period.

Referring to FIG. 3, a power-up flag signal (PVCCH) generator 30 includes a voltage divider 32, a level detector 34, and a driver circuit 36.

An external power voltage Vext is provided to the power-up flag signal (PVCCH) generator 30 as a power-supply voltage.

The external power voltage Vext is divided by the voltage divider 32.

The level detector 34 detects whether or not the output voltage of the voltage divider 32 is higher than or equal to a predetermined voltage level. The power-up flag signal PVCCH is at a high voltage level when the level detector 34 detects that the output voltage of the voltage divider 32 is higher than or equal to the predetermined voltage level. The power-up flag signal PVCCH is output from the driver circuit 36. In this way the power-up flag signal PVCCH is based on the external power voltage.

On the other hand, when the output voltage of the voltage divider 32 is lower than the predetermined voltage level, the power-up flag signal PVCCH has a low voltage level.

Referring to FIG. 4, the power-up flag signal PVCCH has a low level state (the time period T1) when the external power voltage Vext is lower than the predetermined voltage level (for example, about 1 volt) during a power-up period.

Accordingly the power-up flag signal PVCCH determines an initial value of the peripheral circuit in the semiconductor memory device.

For example, the peripheral circuit may include latch circuits (not shown).

The power-up flag signal PVCCH has a high level state when the level of the external power voltage Vext reaches the predetermined voltage level. As a result, the power-up flag signal PVCCH terminates an initialization process regardless of the logic state of each of the latch circuits in the peripheral circuit.

That is, as illustrated in FIG. 4, when the level of the external power voltage Vext reaches about 1 volt, the power-up flag signal PVCCH is set to a high level state (the time period T2).

Figure 5:
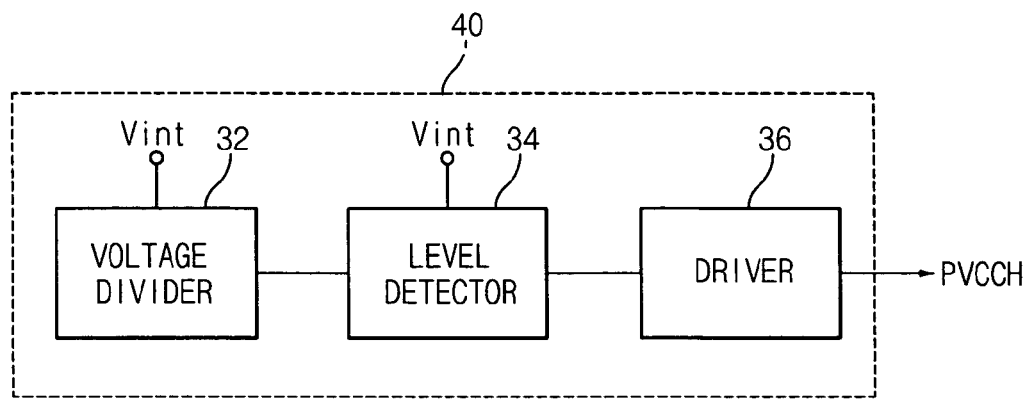
FIG. 5 is a block diagram illustrating the power-up flag signal (PVCCH) generator with an internal power voltage Vint used as a power-supply voltage.
Figure 6:
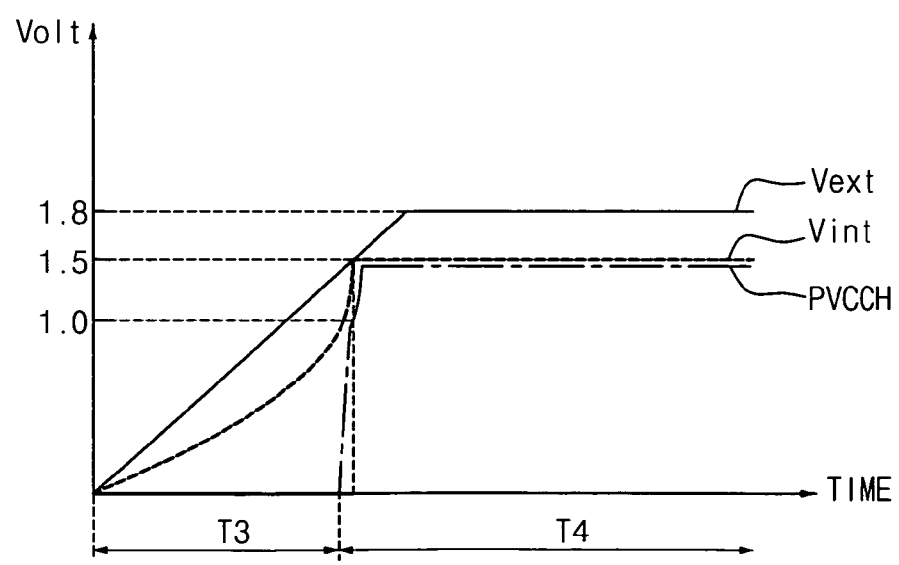
FIG. 6 is a graph illustrating a time-dependent variation of the power-up flag signal PVCCH of FIG. 5 during a power-up period.

FIG. 5 is a block diagram illustrating a power-up flag signal (PVCCH) generator when an internal power voltage Vint is used as a power-supply voltage, and FIG. 6 is a graph illustrating a time-dependent variation of the power-up flag signal PVCCH of FIG. 5 during the power-up period.

Referring to FIG. 6, the power-up flag signal PVCCH has a low level state (the time period T3) when the internal power voltage Vint is lower than the predetermined voltage level (for example, about 1 volt) during the power-up period.

The power-up flag signal PVCCH has a high level state (the time period T4) when the level of the internal power voltage Vint reaches the predetermined voltage level.

As illustrated in FIG. 4, when the power-up flag signal (PVCCH) generator 30 uses the external power voltage Vext as a power source, the power-up flag signal PVCCH has a relatively shorter setting time for reaching a high voltage level compared with the power-up flag signal (PVCCH) generator 40 that uses the internal power voltage Vint as the power source.

If this setting time is too short, an initialization failure on each of the latch circuits in the peripheral circuit may occur since the power-up flag signal PVCCH is set before the latch circuits of the peripheral circuit are set.

On the other hand, when the power-up flag signal (PVCCH) generator 40 uses the internal power voltage Vint as the power source, the power-up flag signal PVCCH has a longer setting time for reaching the high voltage level compared with the power-up flag signal (PVCCH) generator 30 that uses the external power voltage Vext as the power source. As a result, power consumption may increase due to a longer application of a stand-by current since a stand-by time on each of the latch circuits increases during the power-up period.

The embodiments explained below incorporate a power-up flag signal generator 30 that uses the external power voltage Vext to reduce power consumption.

Figure 7:
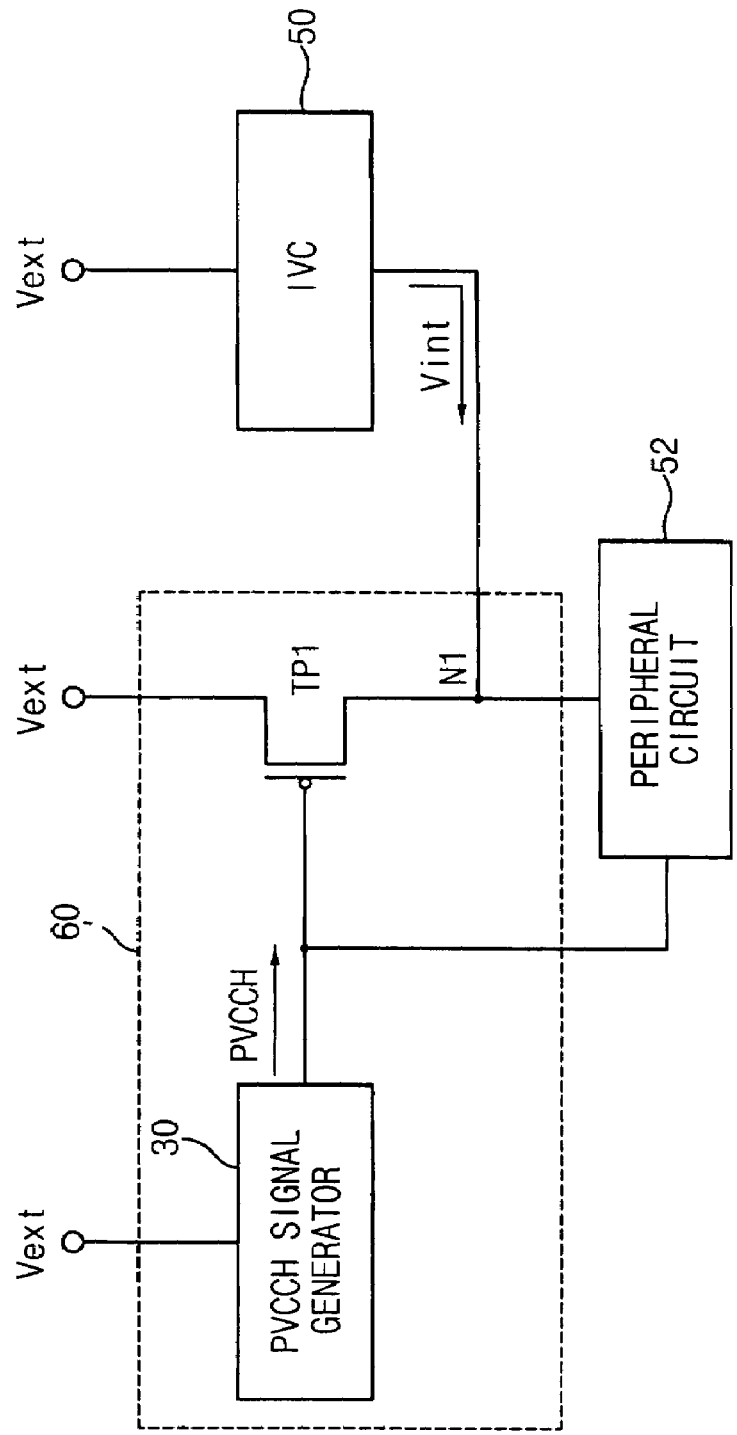
FIG. 7 is a block diagram illustrating a device for controlling an internal power voltage Vint according to an exemplary embodiment of the present invention.
Figure 8:
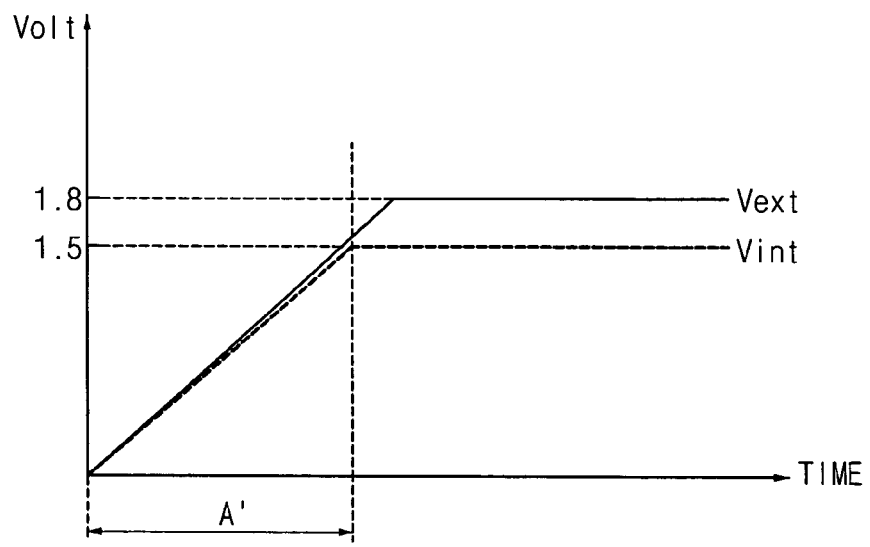
FIG. 8 is a graph illustrating time-dependent variations of the internal power voltage Vint and the external power voltage Vext of FIG. 7 during a power-up period.

FIG. 7 is a block diagram illustrating a device for controlling an internal power voltage Vint according to an exemplary embodiment of the present invention. FIG. 8 is a graph illustrating the time-dependent variations of the internal power voltage Vint and the external power voltage Vext of FIG. 7 during a power-up period.

The power-up flag signal (PVCCH) generator 30 in FIG. 7 uses an external power voltage Vext as the power source, as in FIG. 3.

Referring to FIG. 7, a device 60 for controlling an internal power voltage includes a control circuit coupled between an external power voltage Vext and the internal power voltage Vint, and a power-up flag signal (PVCCH) generator 30.

For example, the control circuit is a voltage controlled current source. The voltage controlled current source may be implemented with a PMOS transistor TP1.

The IVC (Internal Voltage Converter) 50 receives the external power voltage Vext to generate the internal power voltage Vint.

A peripheral circuit 52 is initialized by the power-up flag signal PVCCH, and receives the internal power voltage Vint from the IVC 50 and the control circuit.

The power-up flag signal PVCCH is used as a control voltage for the voltage controlled current source TP1.

The PMOS transistor TP1 is coupled to the IVC 50 and the peripheral circuit 52 via a node N1.

At an early stage of the power-up period, as illustrated in FIG. 4, the power-up flag signal PVCCH of a low level state is applied to the control circuit TP1, and the PMOS transistor TP1 is turned-on and operates in a saturation region.

The PMOS transistor TP1 operating as the voltage controlled current source provides a sufficient power voltage to the peripheral circuit 52. In this case the waveform of the internal power voltage Vint follows the waveform of the external power voltage Vext during the power-up period. In other words, during an early stage, such as time period A' of FIG. 8, of the power-up period, a power-up slope of the internal power voltage Vint is substantially identical to the power-up slope of the external power voltage Vext. Thus, the internal power voltage Vint may have a linear power-up slope.

Accordingly, an initialization failure on each of the latch circuits in the peripheral circuit 52 may be avoided during the power-up period. Also, the power consumption is reduced because of the shortened period that stand-by currents on each of the latch circuits are applied.

When the power-up flag signal PVCCH is set to a high voltage level, as in the case illustrated in FIG. 4, the PMOS transistor TP1 is turned-off.

As a result, the internal power voltage Vint and external power voltage Vext are electrically separated from each other, and the internal power voltage Vint output from the IVC 50 is provided to the peripheral circuit 52.

In this case, because the waveforms of the external power voltage Vext and the internal power voltage Vint have substantially identical slopes, a stable setting time of the power-up flag signal PVCCH may be obtained, and during the early stage of the power-up period, the internal power voltage Vint may have a linear power-up slope.

Figure 9:
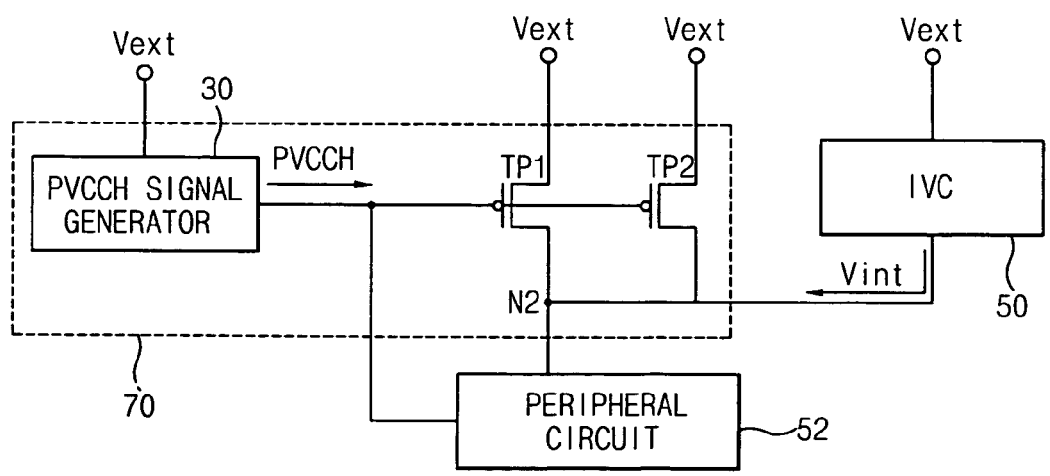
FIG. 9 is a block diagram illustrating a device for controlling an internal power voltage Vint according to another exemplary embodiment of the present invention.

FIG. 9 is a block diagram illustrating a device for controlling an internal power voltage Vint according to another exemplary embodiment of the present invention.

Referring to FIG. 9, at least two PMOS transistors are used as the voltage controlled current source. In detail, the voltage controlled current source may be implemented with at least two PMOS transistors with their gates commonly coupled to each other, and the power-up flag signal PVCCH is applied to the gates as a control voltage. The PMOS transistors TP1 and TP2 are coupled to the peripheral circuit 52 and the IVC 50 via node N2.

During the early stage of the power-up period (the time period A'), a waveform of the internal power voltage Vint quickly follows a waveform of the external power voltage Vext, and the internal power voltage Vint has a slope substantially identical to the slope of the external power voltage Vext.

As a result, the internal power voltage Vint has a linear slope during the early stage of the power-up period.

Figure 10:
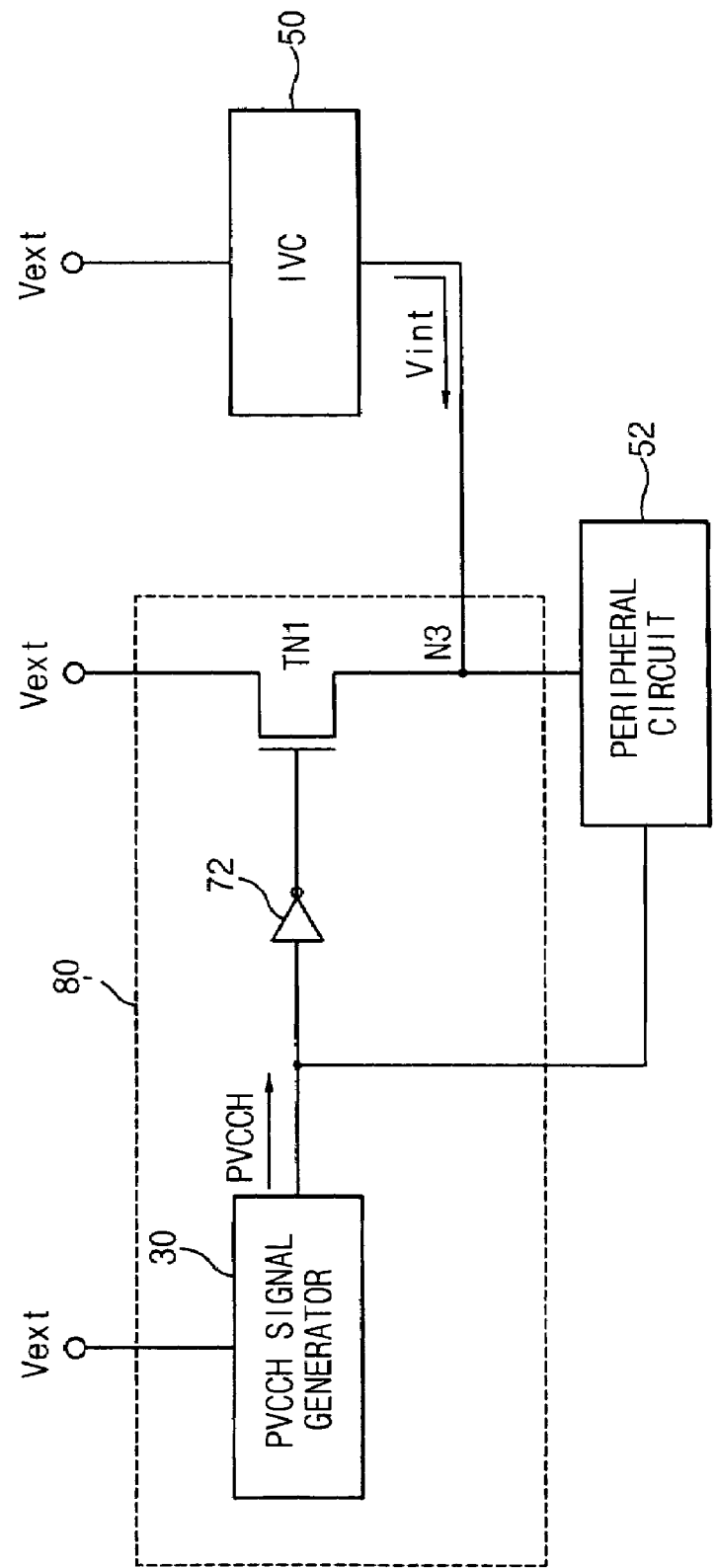
FIG. 10 is a block diagram illustrating a device for controlling an internal power voltage Vint according to still another exemplary embodiment of the present invention.

FIG. 10 is a block diagram illustrating a device for controlling an internal power voltage Vint according to still another exemplary embodiment of the present invention.

Referring to FIG. 10, the voltage controlled current source is implemented with an inverter 72 for receiving the power-up flag signal PVCCH and an NMOS transistor TN1 coupled to the inverter 72.

The NMOS transistor TN1 is coupled to the peripheral circuit 52 and the IVC 50 via node N3.

During an early stage of the power-up period, as illustrated in FIG. 4, when the power-up flag signal PVCCH is applied to the peripheral circuit 52, the NMOS transistor TN1 is turned-on since an output of the inverter 72 has a high voltage level.

When the power-up flag signal PVCCH is set to a high voltage level, as illustrated in FIG. 4, the NMOS transistor TN1 is turned-off since an output of the inverter 72 has a low voltage level.

Therefore, the internal power voltage Vint and the external power voltage are electrically separated from each other, and the internal power voltage Vint output from the IVC 50 is provided to the peripheral circuit 52.

In a semiconductor memory device using internal power voltage and external power voltage as described above, a stable setting time of the power-up flag signal PVCCH may be obtained, and the internal power voltage Vint may have a linear power-up slope. Accordingly, an initialization failure on each of the latch circuits in the peripheral circuit may be avoided during the power-up period. Also, the power consumption is reduced because of the shortened period that stand-by currents on each of the latch circuits are applied.

While the exemplary embodiments of the present invention and their advantages have been described in detail, it should be understood that various changes, substitutions and alterations may be made herein without departing from the scope of the invention.

What is claimed is:

1. A device for controlling an internal power voltage in a semiconductor device comprising:
    an external power supply providing an external supply voltage;
    an internal power supply providing an internal supply voltage;
    a power-up flag signal generator to generate a flag signal having one of a first and second logic level, based on the external or the internal supply voltage during a power-up period; and
    a control circuit to apply the external supply voltage to a peripheral circuit while the flag signal is at the first logic level, and to apply the internal supply voltage to the peripheral circuit while the flag signal is at the second logic level,
    wherein the flag signal has the first logic level during a first time period when the level of the external supply voltage is lower than a predetermined voltage level and has the second logic level during a second time period when the level of the external supply voltage is higher than or equal to the predetermined voltage level.

2. The device of claim 1, wherein the control circuit provides a second internal supply voltage to the peripheral circuit of the semiconductor device during a power-up period, the second internal supply voltage being generated based on the external supply voltage in response to the power-up flag signal having the second logic level.

3. The device of claim 1, wherein the control circuit includes a voltage controlled current source that is coupled between the external power supply and the internal power supply and operates using the flag signal as a control voltage.

4. The device of claim 3, wherein the voltage controlled current source includes a PMOS transistor.

5. The device of claim 3, wherein the voltage controlled current source includes at least two PMOS transistors of which gates are commonly coupled.

6. The device of claim 1, wherein the semiconductor device is a semiconductor memory device.

7. The device of claim 1, wherein the semiconductor device is a DDR SDRAM.

8. A semiconductor memory device comprising:
    a power-up flag signal generator to generate a power-up flag signal based on one of an external power voltage and an internal power voltage during a power-up period;
    a voltage controlled current source responsive to the power-up flag signal, the current source providing the external power voltage to a peripheral circuit of the semiconductor memory device when a level of the external power voltage is lower than a predetermined voltage level; and
    a control circuit to provide the internal power voltage to the peripheral circuit when the level of the external power voltage is higher than or equal to the predetermined voltage level.

9. The semiconductor memory device of claim 8, wherein the voltage controlled current source includes a PMOS transistor.

10. The semiconductor memory device of claim 8, wherein the semiconductor memory device is a DDR SDRAM.

11. A method of controlling an internal power voltage in a semiconductor device comprising:
    generating a control signal when one of an external power voltage and an internal power voltage exceeds a predetermined voltage level during a power-up period; and
    applying the external power voltage to a peripheral circuit of the semiconductor device responsive to the control signal when a level of the external or internal power voltage is lower than the predetermined voltage level; and
    applying the internal power voltage to the peripheral circuit responsive to the control signal when a level of the external or internal power voltage is higher than or equal to the predetermined voltage level.

12. The method of claim 11, wherein the control signal has a low level during a first time period when the level of one of the external power voltage and the internal power voltage is lower than the predetermined voltage level, and has a high level during a second time period when the level of one of the external power voltage and the internal power voltage is higher than or equal to the predetermined voltage level.

13. The method of claim 11, wherein the semiconductor device is a semiconductor memory device.

14. The method of claim 13, wherein the semiconductor device is a DDR SDRAM.

15. A method of controlling an internal power voltage in a semiconductor memory device comprising:

provinding a power-up flag signal based on one of an external power voltage and the internal power voltage during a power-up period;

providing the power-up flag signal as a control voltage to a voltage controlled current source coupled between the external power voltage and the internal power voltage;

providing the external power voltage to a peripheral circuit of the semiconductor memory device when a level of the external power voltage or the internal power voltage is lower than a predetermined voltage; and providing the internal power voltage to the peripheral circuit of the semiconductor memory device when a power level of the external power voltage or the internal power voltage is higher than or equal to the predetermined voltage.

* * * * *